US012787148B2

(12) United States Patent
Weltsch et al.

(10) Patent No.: US 12,787,148 B2
(45) Date of Patent: Nov. 3, 2026

(54) LIQUID COOLED NETWORK-INTERFACE CONTROLLER (NIC) ASSEMBLY

(71) Applicant: MELLANOX TECHNOLOGIES, LTD., Yokneam (IL)

(72) Inventors: Oren Weltsch, The Golan Heights (IL); Yuval Dagan, Gilon (IL); Michal Shlomai Hermon, Zikhron Ya'akov (IL); Rom Becker, Ramat Yishai (IL); Rachel Ruvel, Kiryat Ata (IL); Kfir Katz, Tivon (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 187 days.

(21) Appl. No.: 18/624,662

(22) Filed: Apr. 2, 2024

(65) Prior Publication Data

US 2025/0311084 A1 Oct. 2, 2025

(51) Int. Cl.
*H05K 7/20* (2006.01)
*H05K 1/02* (2006.01)

(52) U.S. Cl.
CPC ....... *H05K 1/0203* (2013.01); *H05K 7/20254* (2013.01); *H05K 7/20772* (2013.01); *H05K 2201/064* (2013.01); *H05K 2201/066* (2013.01)

(58) Field of Classification Search
CPC ... H05K 7/20436–2049; H05K 1/0203; H05K 2201/064; H05K 2201/066; H05K 7/20772; H05K 7/20254
See application file for complete search history.

(56) References Cited

U.S. PATENT DOCUMENTS

| | | | | |
|---|---|---|---|---|
| 8,755,179 | B2 * | 6/2014 | Alyaser | F28D 15/00 361/698 |
| 10,206,312 | B2 | 2/2019 | Shelnutt et al. | |
| 10,856,055 | B2 | 12/2020 | Weltsch et al. | |
| 10,856,446 | B2 | 12/2020 | Boyden et al. | |
| 2012/0281365 | A1 * | 11/2012 | Lima | H05K 7/205 361/720 |
| 2014/0369651 | A1 * | 12/2014 | Ben David | G02B 6/4204 385/89 |
| 2015/0089221 | A1 * | 3/2015 | Taylor | H04L 9/3236 713/168 |

* cited by examiner

*Primary Examiner* — Jacob R Crum
(74) *Attorney, Agent, or Firm* — Alston & Bird LLP

(57) ABSTRACT

Assemblies and methods of manufacturing are provided for a liquid cooled network-interface controller (NIC) assembly configured to receive and operably engage a transceiver module. An example liquid cooled NIC assembly includes a PCB, a first thermally conductive member supported by the PCB, and a second thermally conductive member supported by the first thermally conductive member. The first thermally conductive member is thermally isolated from the second thermally conductive member. A liquid cooling unit may thermally engage the first thermally conductive member and the second thermally conductive member. The first thermally conductive member and the second thermally conductive member are configured to conduct heat toward the liquid cooling unit, such that the liquid cooling unit may dissipate heat from the first thermally conductive member and the second thermally conductive member.

21 Claims, 5 Drawing Sheets

LIQUID COOLED NETWORK-INTERFACE CONTROLLER (NIC) ASSEMBLY

TECHNOLOGICAL FIELD

Example embodiments of the present disclosure relate generally to network-interface controller (NIC) assemblies.

BACKGROUND

The infrastructure of datacenters and the components within have continually evolved in size and complexity. Given this evolution, the cooling of components within the infrastructure has become an important consideration in the structure, configuration, and layout of datacenters. Applicant has identified numerous deficiencies and problems associated with conventional liquid cooled solutions. Through applied effort, ingenuity, and innovation, many of these identified problems have been solved by developing solutions that are included in embodiments of the present disclosure, many examples of which are described in detail herein.

BRIEF SUMMARY

Embodiments of the present disclosure are directed to a liquid cooled network-interface controller (NIC) assembly and associated methods of manufacturing liquid cooled NIC assemblies. The liquid cooled NIC assembly may be configured to thermally isolate members within the NIC assembly, conduct heat to a liquid cooling unit, and fit within a single slot of a datacenter rack. In some embodiments, the assembly may include a printed circuit board (PCB), a first thermally conductive member supported by the PCB, and a second thermally conductive member supported by the first thermally conductive member. The second thermally conductive member may be thermally isolated from the first thermally conductive member. The assembly may further include a liquid cooling unit supported by and in thermal engagement with the first thermally conductive member and the second thermally conductive member. The first thermally conductive member and the second thermally conductive member may be configured to conduct heat toward the liquid cooling unit. The liquid cooling unit may be configured to dissipate heat from the first thermally conductive member and the second thermally conductive member.

In some embodiments, the liquid cooling unit may comprise an inlet, an outlet, and a cooling loop defined between the inlet and the outlet. The cooling loop may be configured to circulate coolant for dissipating heat from the first thermally conductive member and the second thermally conductive member.

In some embodiments, a path defined by the cooling loop of the liquid cooling unit overlays the first thermally conductive member and the second thermally conductive member.

In some embodiments, the assembly may further include a thermally insulative layer disposed between the first thermally conductive member and the second thermally conductive member. The thermally insulative layer may be configured to thermally isolate the first thermally conductive member from the second thermally conductive member.

In some embodiments, the thermally insulative layer comprises polyetherketone (PEEK) plastic.

In some embodiments, the liquid cooling unit may be dimensioned to accommodate the first thermally conductive member and the second thermally conductive member within a single slot receiver of the liquid cooled NIC assembly.

In some embodiments, the assembly may further include a heat pipe overlaying and thermally engaging the second thermally conductive member. The heat pipe may be configured to direct heat from the second thermally conductive member to the liquid cooling unit.

In some embodiments, the assembly may further include a transceiver receptacle configured to receive and operatively engage a transceiver module. The second thermally conductive member may be configured to direct heat from the transceiver module received by the transceiver receptacle to the heat pipe.

In some embodiments, the first thermally conductive member may be a thermal transfer plate (TTP).

In some embodiments, the TTP comprises at least one of an aluminum material, copper material, or a stainless-steel material.

In some embodiments, the second thermally conductive member is a thermal pad.

In other embodiments, a liquid cooled network-interface controller (NIC) assembly configured to receive and operably engage with a transceiver module is provided. The assembly may include a printed circuit board (PCB), a first thermally conductive member and a second thermally conductive member supported by the PCB, and a liquid cooling unit defining a first region and a second region. In some embodiments, the first thermally conductive member is configured to conduct heat toward the first region of the liquid cooling unit, and the second thermally conductive member is configured to conduct heat toward the second region of the liquid cooling unit. In some embodiments, the PCB, the first thermally conductive member, the second thermally conductive member, and the liquid cooling unit may be configured to be received by a single slot of a receiver of the NIC assembly.

In some embodiments, the liquid cooling unit includes an inlet, an outlet, and a cooling loop defined between the inlet and the outlet. The cooling loop may be configured to circulate coolant for dissipating heat from the first thermally conductive member and the second thermally conductive member.

In some embodiments, the assembly further includes a thermally insulative layer disposed between the first thermally conductive member and the second thermally conductive member. The thermally insulative layer may be configured to thermally isolate the first therm ally conductive member from the second thermally conductive member.

In some embodiments, the first region of the liquid cooling unit may define a first height and the second region of the liquid cooling unit may define a second height. The first height may be different from the second height.

In other embodiments, a method of manufacturing a liquid cooled network-interface controller (NIC) assembly configured to receive and operably engage with a transceiver module is provided. The method may include providing a printed circuit board (PCB), disposing a first thermally conductive member on a top surface of the PCB, and providing a second thermally conductive member proximate the first thermally conductive member. The second thermally conductive member may be thermally isolated from the first thermally conductive member. The method may further include disposing a liquid cooling unit proximate the first thermally conductive member and the second thermally conductive member. In some embodiments, the first thermally conductive member and the second thermally conductive member may be configured to conduct heat toward the liquid cooling unit. The liquid cooling unit may be configured to dissipate heat from the first thermally conductive member and the second thermally conductive member.

In some embodiments, the liquid cooling unit may include an inlet, an outlet, and a cooling loop defined between the inlet and the outlet. The cooling loop may be configured to circulate coolant for dissipating heat from the first thermally conductive member and the second thermally conductive member.

In some embodiments, a path defined by the cooling loop of the liquid cooling unit may overlay the first thermally conductive member and the second thermally conductive member.

In some embodiments, the method may further include disposing a thermally insulative layer between the first thermally conductive member and the second thermally conductive member. The thermally insulative layer may be configured to thermally isolate the first thermally conductive member and the second thermally conductive member.

In some embodiments, the method further includes disposing a heat pipe at least partially on the second thermally conductive member. The heat pipe may be configured to thermally engage the second thermally conductive member and the liquid cooling unit.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Figure 1:
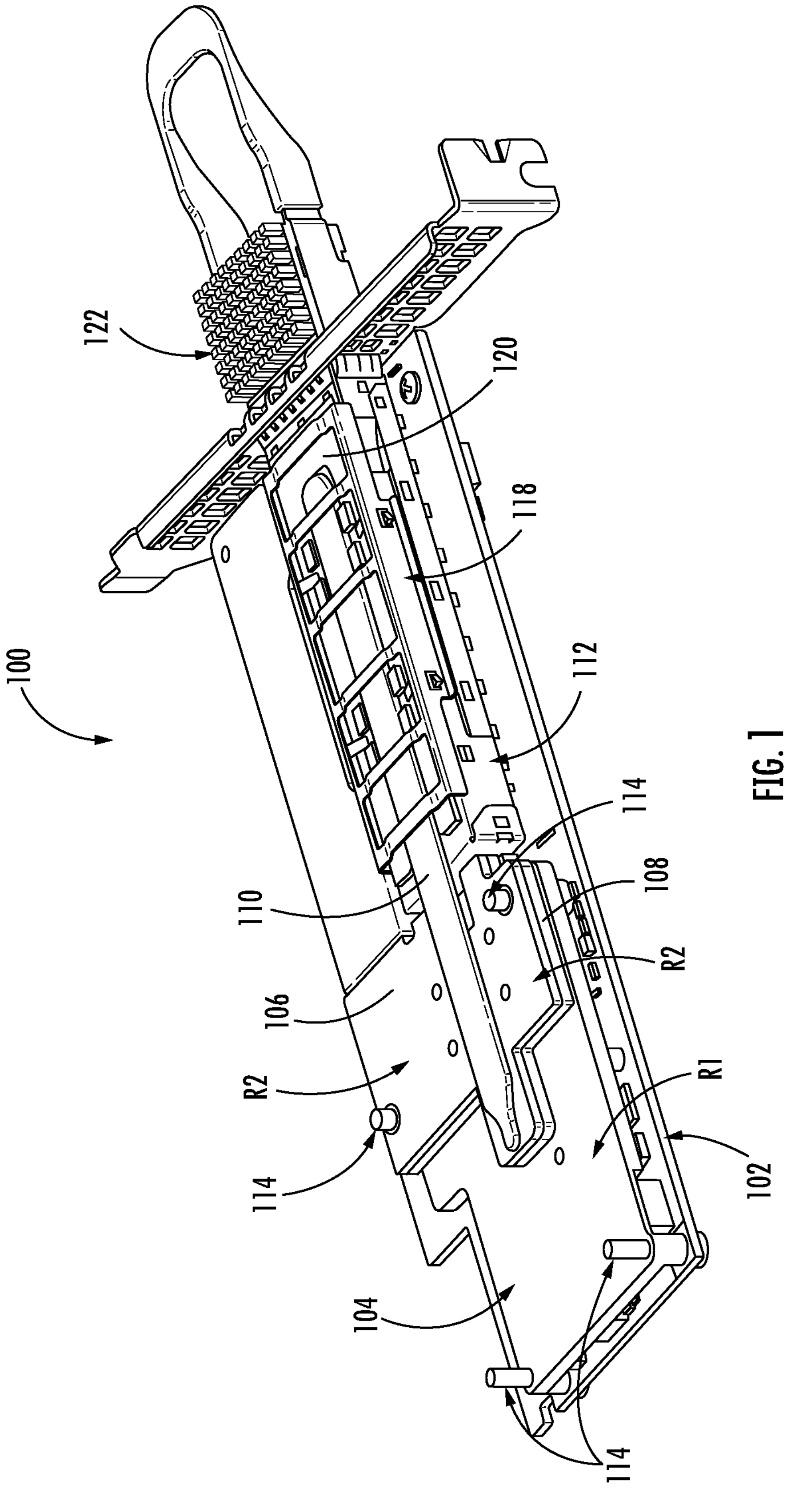
FIG. 1 illustrates a perspective view of a network-interface controller (NIC) assembly in accordance with some embodiments described herein.

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

Printed circuit boards (PCBs) generally refer to mediums used to connect electronic components to one another in a controlled manner. PCBs may be configured in a number of ways and may be single-sided (e.g., one copper layer), double-sided (e.g., two copper layers), or multi-layer (e.g., outer and inner layers of copper, alternating with layers of substrate). Electrical components may be fixed to conductive pads on the outer layer of a PCB. The conductive pads, in turn, may have a shape designed to accept the components' terminals to both electrically connect and mechanically attach the electrical components to the PCB. The electrical connection and mechanical attachment may further be accomplished by soldering (a process by which two items are connected using a melted conductive material to attach the two items to each other) and/or using vias, which may refer to plated-through holes that allow interconnections between layers of the PCB.

As described herein, a transceiver module may refer to a device capable of transmitting and receiving signals used in communication and data storage devices. Signals received and transmitted by a transceiver module may include but may not be limited to digital, analog, electrical, optical, radio, and/or wireless signals. The transceiver module may operably engage/work in conjunction with elements of the liquid cooled network-interface controller (NIC) assembly described herein.

As described herein, an NIC may refer to an assembly of hardware components associated with facilitating connections between devices (e.g., a computer) and a network. One skilled in the art, in light of this disclosure, may apply the innovations described herein to a liquid cooled NIC, such as a liquid cooled host channel adapter (HCA). For instance, a single slot liquid cooled HCA assembly may implement the structures and manufacturing methods for a liquid cooled NIC described in greater detail below.

As described herein, "thermally conductive" may refer to a device, material, structure, or other component with the ability to transfer, exchange, and/or otherwise facilitate the flow of heat. Thermally conductive components may transfer heat through conduction, convection, radiation, and/or other forms of heat exchange, as will be evident to one of ordinary skill in the art in light of the present disclosure. Materials and components described as thermally conductive may, for example, comprise a comparatively higher coefficient of thermal conductivity than surrounding materials and/or components. A thermally conductive device, material, structure, etc. may be configured (e.g., sized and shaped) to cause heat to transfer in a desired direction or manner, such as from a first component toward a second component.

As datacenters continue to expand in complexity and size, the challenges associated with the cooling of components within the datacenter increase, particularly when operating in constrained spaces. Network-interface controller (NIC) assemblies, for instance, may enable network connections within a datacenter but may not perform as intended due to heat generation within the assembly and exposure to heat generated by neighboring components. Conventional NIC assemblies may be housed in single-slot receivers with an accompanying cooling system managing a plurality of assemblies. For instance, one conventional solution for heat generated by NIC assemblies has been to dispose a liquid cooling unit proximate a plurality of NIC assemblies (e.g., a single liquid cooling unit may thermally engage multiple NIC assemblies). A single cooling system for a plurality of single slot receivers may utilize a large volume of space and material in an already constrained and tightly-packed environment. Additionally, the distribution of heat within a NIC assembly may cause functionality issues of the NIC assembly if left unmanaged by the implemented cooling system. A cooling system designed to cool an individual NIC may provide greater benefits; however, such conventional cooling systems still require an open slot proximate the NIC to be cooled, which limits the number of other components that can reside in the same location.

In order to address these issues and others, embodiments of the present disclosure are directed to a single slot liquid cooled NIC assembly that is configured (e.g., sized and shaped) to fit within a single slot of a datacenter rack. The single slot liquid cooled NIC assembly described herein may use thermally conductive and thermally isolating materials to conduct heat toward a single liquid cooling unit within the assembly. The assembly described not only individually reduces the thermal burden of the NIC assembly within the confines of the single slot receiver but may also manage the distribution of heat within the assembly. Heat may be directed toward the liquid cooling unit and away from both potentially heat sensitive components and more heat resistant components within the assembly, while enabling components to operate at different levels of heat exposure. Furthermore, the embodiments described herein may enable single slot liquid cooling for NIC assemblies to utilize less space and material than previous conventional solutions.

With reference to FIG. 1, a network-interface controller (NIC) assembly 100 according to some embodiments is illustrated. As shown, the NIC assembly 100 may include a printed circuit board (PCB) 102 supporting a first thermally conductive member 104, and a second thermally conductive member 106 supported by the first thermally conductive member. The first thermally conductive member 104 may thermally engage the PCB 102 while being thermally isolated from the second thermally conductive member 106. Thermal isolation of the first thermally conductive member 104 from the second thermally conductive member 106 may reduce heat transfer toward sensitive components within the assembly. For instance, components thermally engaged with the first thermally conductive member 104 (e.g., the PCB 102) may operate in a reduced capacity when exposed to heat beyond a given threshold (e.g., a max PCB temperature). Components thermally engaged with the second thermally conductive member 106 may be more heat tolerant than components thermally engaged with the first thermally conductive member 104. Therefore, components thermally engaged with the second thermally conductive member 106 may have a higher tolerance for heat and, as a result, may continue to operate properly at a higher heat exposure than components thermally engaged with the first thermally conductive member 104 (e.g., components engaged with the second thermally conductive member may operate at a temperature higher than the max PCB temperature). As such, heat within the NIC assembly 100 may, by virtue of embodiments of the present invention, be directed toward heat resistant components and away from more sensitive components, providing greater flexibility in heat exposure of the assembly overall while directing heat toward a liquid cooling unit. For instance, heat from the PCB 102 may be directed toward the first thermally conductive member 104, while heat from the NIC infrastructure (including the PCB 102, a transceiver module 122, and a transceiver receptacle 112 in the depicted example, described in greater detail below) may be directed toward the second thermally conductive member 106. Heat from the first thermally conductive member 104 and heat from the second thermally conductive member 106 may in turn be directed toward a liquid cooling unit, as described in greater detail below.

In some embodiments, the first thermally conductive member 104 may be a thermal transfer plate (TTP) wherein heat is directed from the PCB 102 toward the TTP and into a liquid cooling unit. The first thermally conductive member 104 may comprise thermally conductive materials including but not limited to aluminum, steel, copper, and/or alloys of these and/or other materials. Thermal engagement between the first thermally conductive member 104 and the PCB 102 may, for example, be achieved through contact in some embodiments, and the heat may be transferred through conduction and/or other forms of heat transfer. In other embodiments, the thermal engagement between the first thermally conductive member 104 and the PCB 102 may be achieved through proximity of the first thermally conductive member 104 to the PCB 102, and heat may be transferred through convection, radiation, and/or other forms of heat transfer. The first thermally conductive member 104 may be supported by the PCB 102, and in some cases the first thermally conductive member 104 may at least partially overlay a top surface of the PCB.

In some embodiments, the second thermally conductive member 106 may be a thermal pad. The thermal pad may, for example, be a thermally conductive and compressible material that is supported by a thermally insulative layer 108. The thermal pad may comprise one or more malleable materials including but not limited to silicone-based materials, paraffin wax, and/or thermal paste. The second thermally conductive member 106 may be subjected to pressures and forces within the NIC assembly 100. In embodiments in which the second thermally conductive member 106 is a thermal pad, such pressures and forces may compress and/or alter the dimensions of the thermal pad.

As noted above, a thermally insulative layer 108 may, in some embodiments, be disposed between the first thermally conductive member 104 and the second thermally conductive member 106. The thermally insulative layer 108 may be configured to thermally isolate the first thermally conductive member 104 from the second thermally conductive member 106. For instance, heat from the PCB 102 directed toward (e.g., into) the first thermally conductive member 104 may then be directed toward a liquid cooling unit rather than the second thermally conductive member 106. Similarly, heat directed toward (e.g., into) the second thermally conductive member 106 from the transceiver module 122 may be directed toward the liquid cooling unit rather than the first thermally conductive member 104. Thermal isolation or "thermally isolated" may refer to the property of allowing comparatively negligible heat transfer to occur. In some embodiments, the thermally insulative layer may comprise a thermally insulative material including but not limited to polyetherketone (PEEK) plastic.

In some embodiments, the NIC assembly 100 may further include a transceiver receptacle 112, supported by (e.g., secured to) the PCB 102. The transceiver receptacle 112 may be configured to receive and operatively engage a transceiver module 122. In some embodiments, the transceiver module 122 may be attached to the transceiver receptacle 112. The transceiver receptacle 112 may be configured to direct heat from the transceiver module 122 (e.g., heat generated by the transceiver module during operation) toward a conduction plate 120 and to a heat pipe 110 disposed on the transceiver receptacle 112 and/or the transceiver module 122, such as through conduction. The conduction plate 120 may be disposed on the transceiver receptacle 112 with the heat pipe 110 disposed on the conduction plate. In some embodiments, the conduction plate 120 may direct heat from the transceiver receptacle 112 toward the heat pipe 110. For example, the transceiver receptacle 112 may comprise a thermally conductive material (e.g., metal) and may be configured to act as a heat sink with respect to heat generated by the transceiver module 122 housed therein. The conduction plate 120 may similarly comprise a thermally conductive material configured to direct heat from the transceiver receptacle 112 and the transceiver module 122 toward the heat pipe 110. The heat pipe 110 may, in some embodiments, be an elongated strip of thermally conductive material (e.g., metal) into which heat may be conducted and through which heat may flow. Heat flowing into the heat pipe 110 (e.g., from the transceiver receptacle 112, the conduction plate 120, and/or the transceiver module 122) may thus be transferred via the heat pipe away from the transceiver receptacle 112, the conduction plate 120, and/or the transceiver module 122 and to the second thermally conductive member 106, as described above.

In some embodiments, a transceiver casing 118 may be provided that is configured to at least partially secure the conduction plate 120 and the heat pipe 110 within the transceiver receptacle 112. The transceiver casing 118 may be disposed on the transceiver receptacle 112, as shown in FIG. 1, and may at least partially surround the conduction plate 120 and the heat pipe 110. The transceiver casing 118 may be configured to be attached to an outer surface of the transceiver receptacle 112, such as via fasteners or other attachment mechanisms, thereby securing the conduction plate 120 and the heat pipe 110 to the transceiver receptacle 112.

As described above, in some embodiments, the NIC assembly 100 may thus further include a heat pipe 110. The heat pipe 110 may overlay and thermally engage the second thermally conductive member 106, the conduction plate 120, and/or the transceiver receptacle 112. As described above, the heat pipe 110 may be configured to direct heat from the transceiver receptacle 112 and/or conduction plate 120 to the second thermally conductive member 106 and toward a heat disposal unit (e.g., a liquid cooling unit as described in greater detail below). Thermal engagement between the heat pipe 110 and the second thermally conductive member 106 may be facilitated through conduction, with the heat pipe disposed at least partially on the second thermally conductive member 106. The heat pipe 110 may similarly thermally engage the transceiver receptacle 112 and the conduction plate 120 through conduction with the heat pipe. The heat pipe 110 may also be partially disposed on the transceiver receptacle 112 and/or the conduction plate 120. For example, as shown in FIG. 1, at least a portion of the heat pipe 110 may thermally engage the second thermally conductive member 106, and at least another portion of the heat pipe may thermally engage the transceiver receptacle 112 and/or the conduction plate 120. The transceiver receptacle 112, the conduction plate 120, the overlying heat pipe 110, and the PCB 102 supporting the transceiver receptacle may be dimensioned to fit within a single slot receiver of a liquid cooled NIC assembly 300, as described in greater detail below.

In some embodiments, the first thermally conductive member 104 may be supported by the PCB 102 through a first set of fasteners 114. The first set of fasteners 114 may include bolts, screws, pins, and/or the like. The first set of fasteners 114 may attach the PCB 102, the first thermally conductive member 104, the insulative layer 108, the second thermally conductive member 106, and a liquid cooling unit as described in greater detail below.

Figure 2A:
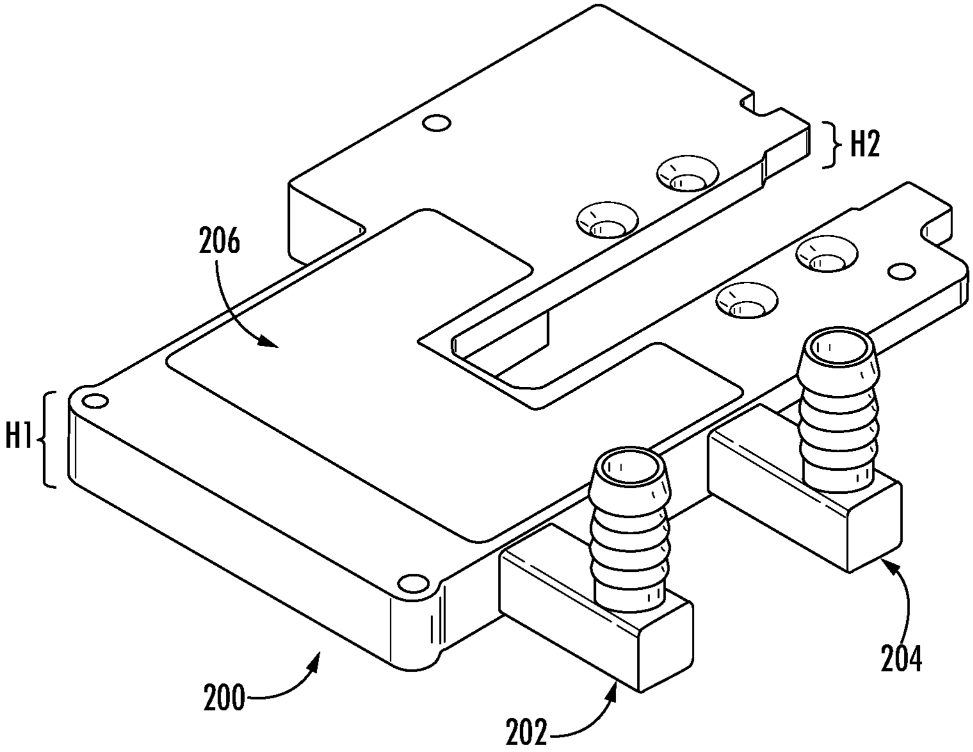
FIG. 2A illustrates a perspective view of a liquid cooling unit with a cover plate in accordance with some embodiments described herein.
Figure 2B:
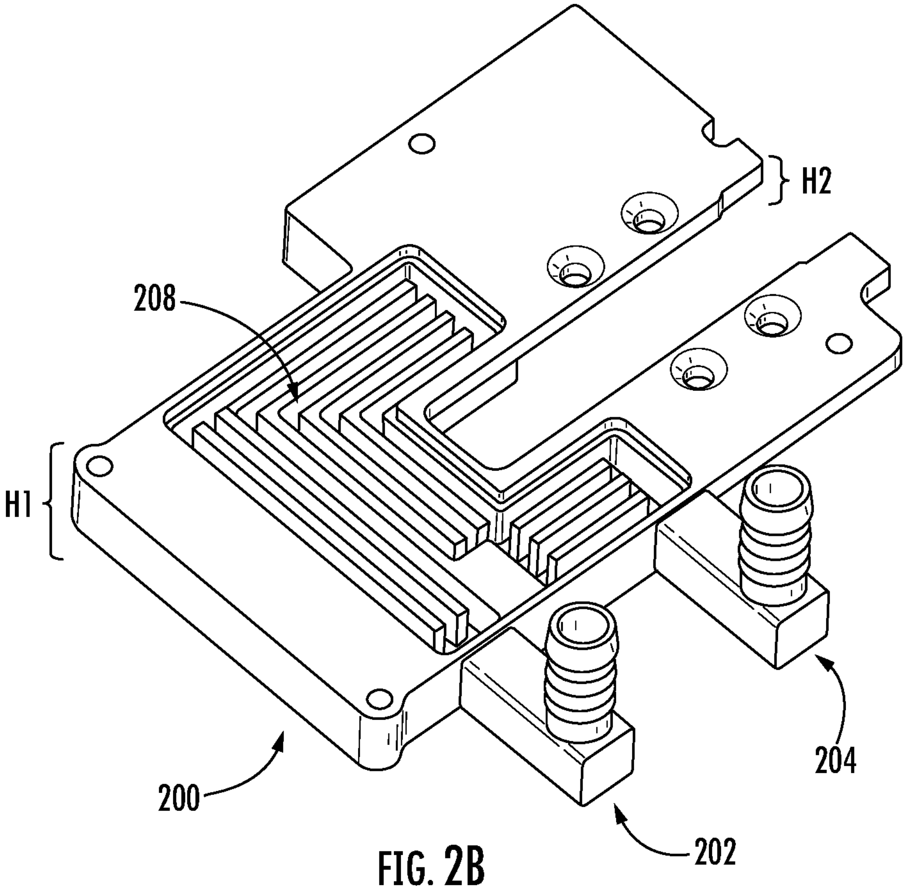
FIG. 2B illustrates the liquid cooling unit of FIG. 2A with the cover plate removed in accordance with some embodiments described herein.

With reference to FIGS. 2A and 2B, schematic illustrations of a liquid cooling unit 200 are illustrated respectively with and without a cover plate 206. For example, with reference to FIG. 2A, the liquid cooling unit 200 may comprise an inlet 202, an outlet 204, a cooling loop 208 defined between the inlet and the outlet, and a cover plate 206 covering the cooling loop. FIG. 2B depicts the liquid cooling unit 200 of FIG. 2A but with the cover plate 206 removed for purposes of explanation so as to provide an unobstructed view of an example cooling loop 208. Coolant (e.g., water or another liquid configured to hold and carry heat) may enter the liquid cooling unit 200 through the inlet 202, circulate through the cooling loop 208, and exit the cooling unit through the outlet 204. The coolant, while circulating through the cooling loop 208 may pass through a series of loops within the liquid cooling unit 200. Arrangement, placement, and intricacy (e.g., the pathway, the number of bends, and number of channels) of the cooling loop 208 may be designed based on the configuration of the first and second thermally conductive members seen in FIG. 1 and may be optimized to facilitate cooling of the components the liquid cooling unit is intended to cool. The placement, orientation, and location of the inlet 202 and the outlet 204 may similarly be designed to accommodate the cooling loop 208, the first thermally conductive member 104, and the second thermally conductive member 106. The path defined by the cooling loop 208 may overlie the first and second thermally conductive members 104, 106 of the NIC assembly (shown in FIG. 1). In some embodiments, the cooling loop 208 may comprise coolant conduits through which coolant may flow including but not limited to pipes, tubes, and pathways. Heat from the first thermally conductive member 104 and the second thermally conductive member 106 may be transferred to the liquid cooling unit 200, then conducted toward the coolant circulating within the unit.

Figure 3A:
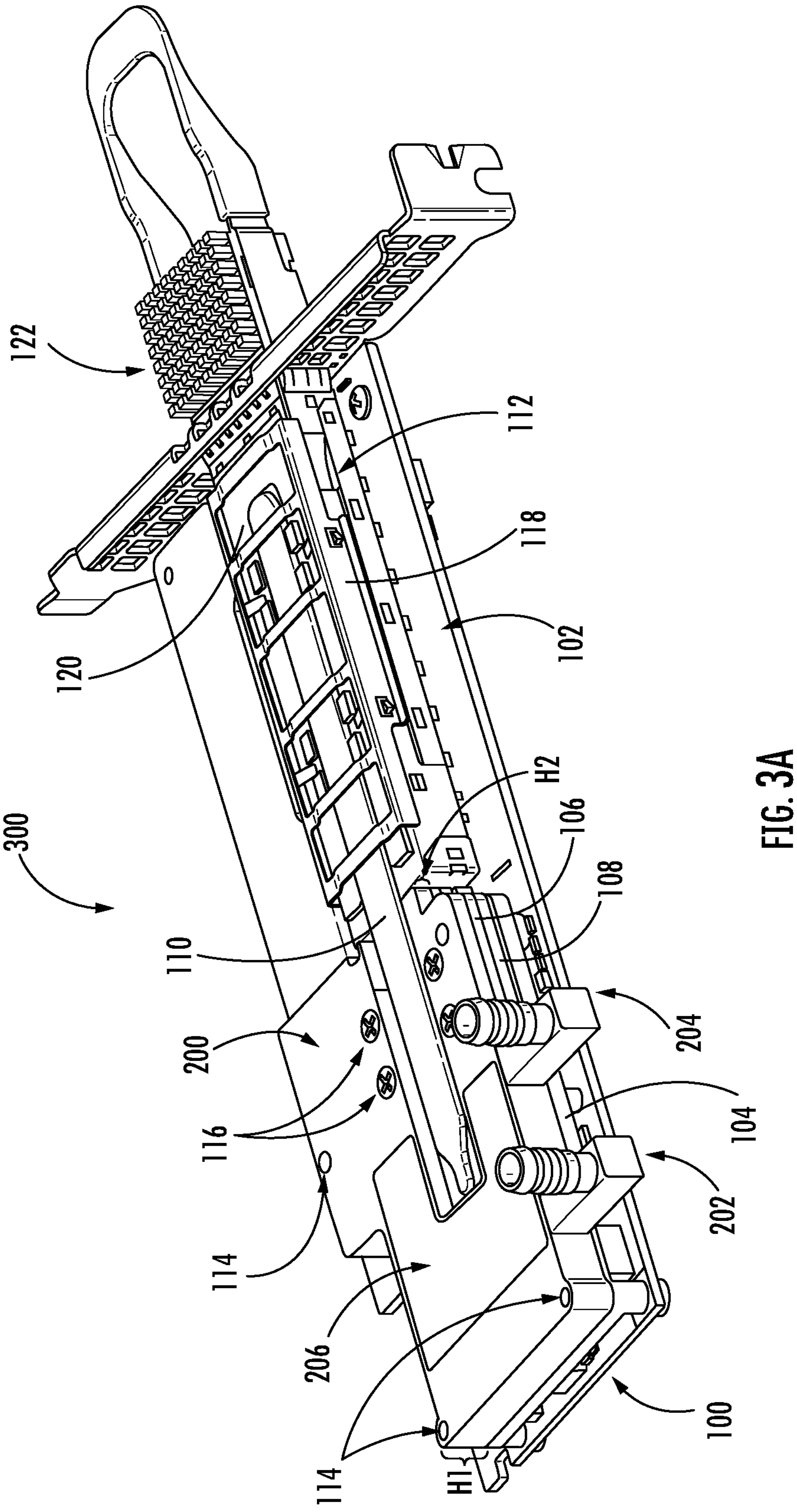
FIG. 3A illustrates a liquid cooled NIC assembly in accordance with some embodiments described herein.

With reference to FIGS. 2A, 2B, and 3A, in some embodiments, the liquid cooling unit 200 may be dimensioned to accommodate the first thermally conductive member 104 and the second thermally conductive member 106 of FIG. 1 within a single slot receiver of a liquid cooled assembly. For instance, the liquid cooling unit 200 may define a first region R1 and a second region R2. The first region R1 may have a first operating temperature (e.g., a maximum temperature associated with the first region R1), whereas the second region R2 may have a second operating temperature (a maximum temperature associated with the second region R2) based on the components disposed in the first and second regions, respectively. The first thermally conductive member 104 may be configured to conduct heat toward the first region R1 of the liquid cooling unit, and the second thermally conductive member 106 may be configured to conduct heat toward the second region R2 of the liquid cooling unit. The first region R1 and second region R2 of the liquid cooling unit 200 may transfer heat to liquid coolant circulating within the cooling loop 208. The first region R1 of the liquid cooling unit 200 may, in some embodiments, define a first height H1, and the second region R2 of the liquid cooling unit may define a second height H2. The first height H1 may be different from the second height H2. The summation of the first height H1, the first thermally conductive member 104 and the PCB 102 may be equal to the summation of the second height H2, the second thermally conductive member 106, the thermally insulative layer 108, the first thermally conductive member 104, and the PCB 102. Depending on the configuration and heights of the components of the NIC assembly, the first height H1 may be greater than or equal to the second height H2. In this way, the PCB 102, the first thermally conductive member 104, the second thermally conductive member 106, and the liquid cooling unit 200 may be configured to be received by a single slot of a receiver of the NIC assembly.

Figure 3B:
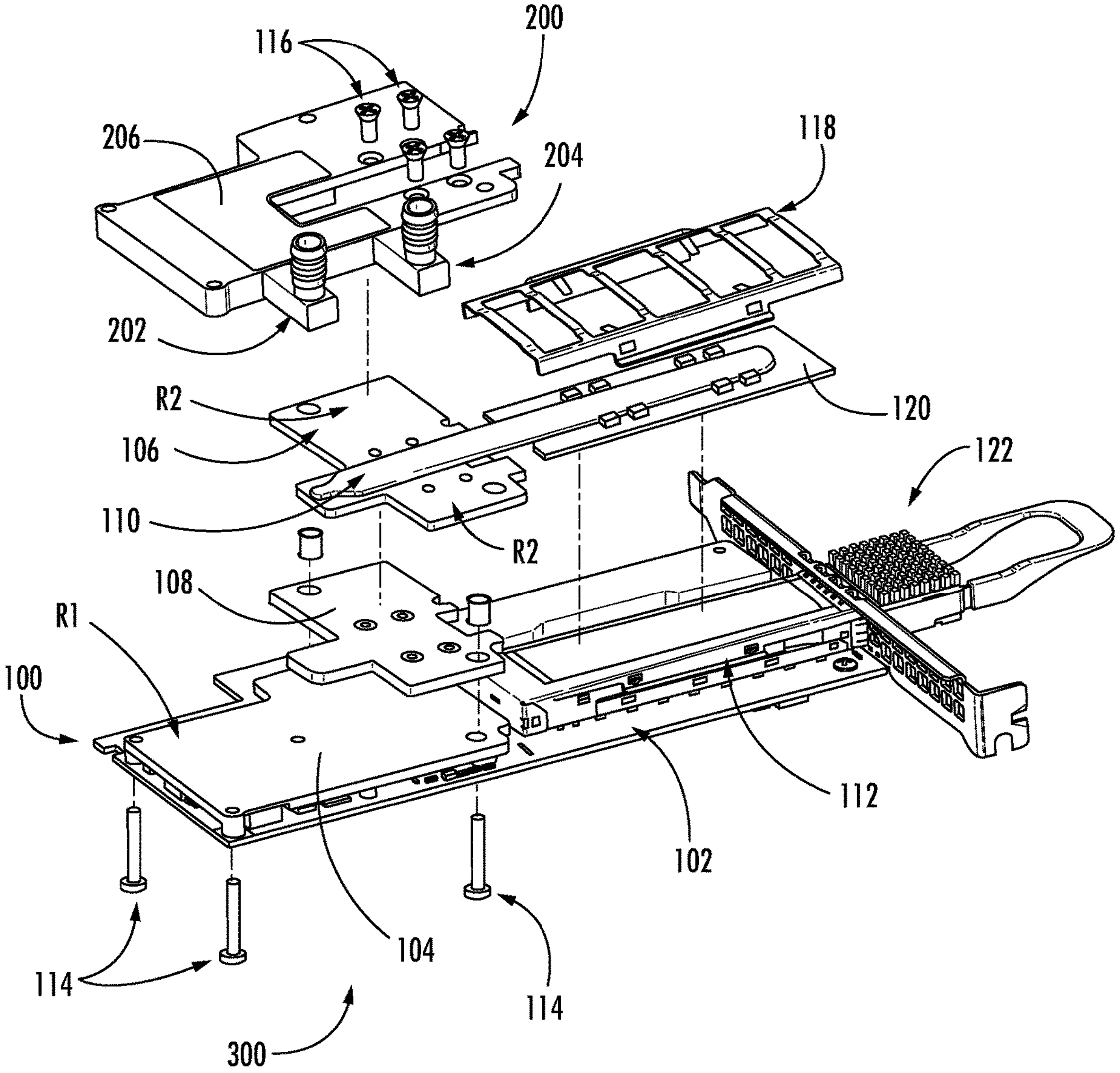
FIG. 3B illustrates an exploded view of the liquid cooled NIC assembly of FIG. 3A in accordance with some embodiments described herein.

With reference to FIGS. 3A-3B, a liquid cooled NIC assembly 300 is illustrated in an assembled view (FIG. 3A) and an exploded view (FIG. 3B), respectively. In the depicted example, the liquid cooled NIC assembly 300 may comprise the NIC assembly 100 of FIG. 1 and the liquid cooling unit 200 of FIG. 2. The liquid cooled NIC assembly 300 may be dimensioned to receive and operatively engage a transceiver module 122 in a single slot receiver. The liquid cooling unit 200 may be attached to the NIC assembly 100 through the first set of fasteners 114 described above and a second set of fasteners 116. Similarly to the first set of fasteners 114, the second set of fasteners 116 may comprise screws, bolts, pins, and/or the like. The second set of fasteners 116 may pass through and secure the insulative layer 108, the second thermally conductive member 106, and the liquid cooling unit 200 to the first thermally conductive member 104.

The liquid cooling unit 200, as described above, may be configured to correspond to the dimensions and heights of the NIC assembly 100. For instance, the first height H1 of the liquid cooling unit 200 may be such that the sum of the first height H1, the height (e.g., thickness) of the PCB 102, and the height (e.g., thickness) of the first thermally conductive member 104 may be equal to the sum of the second height H2, the height (e.g., thickness) of the second thermally conductive member 106, the height (e.g., thickness) of the insulative layer 108, the height (e.g., thickness) of the first thermally conductive layer, and the height (e.g., thickness) of PCB.

Figure 4:
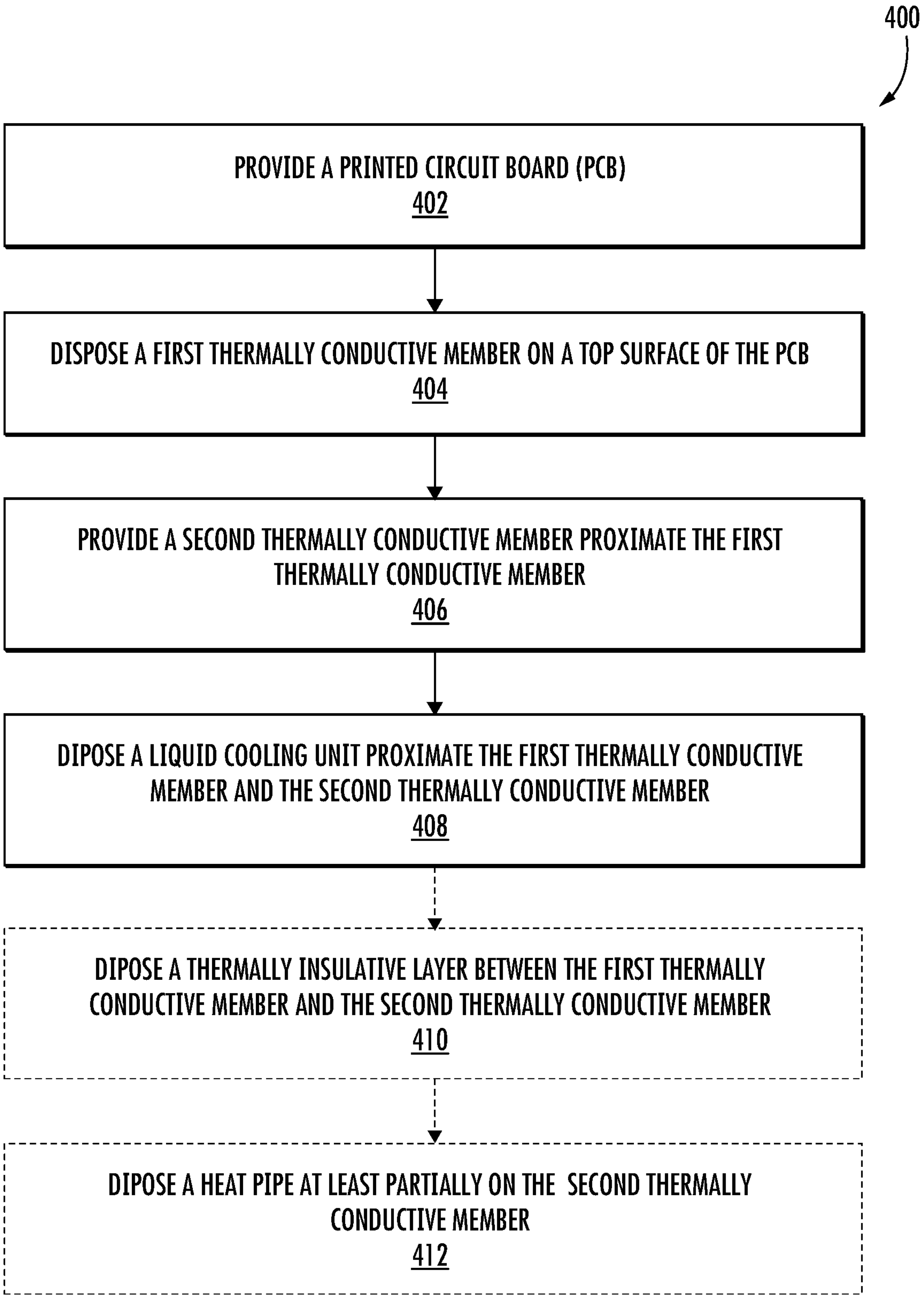
FIG. 4 is a flowchart illustrating a method of manufacturing a liquid cooled NIC assembly in accordance with some embodiments described herein.

With reference to FIG. 4, a method 400 of manufacturing a liquid cooled NIC assembly configured to receive and operably engage with a transceiver module is provided. The method may comprise providing a PCB (Block 402) and disposing a first thermally conductive member on a top surface of the PCB (Block 404). The first thermally conductive member may thermally engage the PCB, as described above in connection with FIGS. 1-3B. The method 400 may further include providing a second thermally conductive member proximate the first thermally conductive member (Block 406). Providing the second thermally conductive member proximate the first thermally conductive member may refer to placing, supporting, disposing, and/or attaching the second thermally conductive member on or near the first thermally conductive member. As described above in connection with FIGS. 1 and 3A-3B, for example, the second thermally conductive member may be thermally isolated from the first thermally conductive member. The method may further include disposing a liquid cooling unit proximate the first thermally conductive member and the second thermally conductive member (Block 408). As described above with respect to FIGS. 2A-3B, the first thermally conductive member and the second thermally conductive member may be configured to conduct heat toward the liquid cooling unit, and the liquid cooling unit may in turn be configured to dissipate heat from the first thermally conductive member and the second thermally conductive member.

In some embodiments, the method 400 may include disposing a thermally insulative layer between the first thermally conductive member and the second thermally conductive member (Block 410). The thermally insulative layer may be configured to thermally isolate the first thermally conductive member and the second thermally conductive member. In some embodiments, the method may include disposing a heat pipe at least partially on the second thermally conductive member (Block 412). The heat pipe may be configured to thermally engage the second thermally conductive member and the liquid cooling unit, as described above.

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of any network-interface controller assembly. In addition, the methods described above may include fewer steps in some cases, while in other cases may include additional steps. The steps of the method and modifications to the steps of the method described above, in some cases, may be performed in any order and in any combination.

Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

What is claimed is:

1. A liquid cooled network-interface controller (NIC) assembly configured to receive and operably engage a transceiver module, the assembly comprising:
- a printed circuit board (PCB);
- a first thermally conductive member supported by the PCB;
- a second thermally conductive member supported by the first thermally conductive member, wherein the second thermally conductive member is thermally isolated from the first thermally conductive member; and
- a liquid cooling unit supported by and in thermal engagement with the first thermally conductive member and the second thermally conductive member,
- wherein the first thermally conductive member is configured to conduct heat toward the liquid cooling unit,
- wherein the second thermally conductive member is configured to conduct heat toward the liquid cooling unit, and
- wherein the liquid cooling unit is configured to dissipate heat from the first thermally conductive member and the second thermally conductive member.

2. The liquid cooled NIC assembly of claim 1, wherein the liquid cooling unit comprises an inlet, an outlet, and a cooling loop defined between the inlet and the outlet, wherein the cooling loop is configured to circulate coolant for dissipating heat from the first thermally conductive member and the second thermally conductive member.

3. The liquid cooled NIC assembly of claim 2, wherein a path defined by the cooling loop of the liquid cooling unit overlays the first thermally conductive member and the second thermally conductive member.

4. The liquid cooled NIC assembly of claim 2 further comprising a thermally insulative layer disposed between the first thermally conductive member and the second thermally conductive member, wherein the thermally insulative layer is configured to thermally isolate the first thermally conductive member from the second thermally conductive member.

5. The liquid cooled NIC assembly of claim 4, wherein the thermally insulative layer comprises polyetherketone (PEEK) plastic.

6. The liquid cooled NIC assembly of claim 1, wherein the liquid cooling unit is dimensioned to accommodate the first thermally conductive member and the second thermally conductive member within a single slot receiver of the liquid cooled NIC assembly.

7. The liquid cooled NIC assembly of claim 1 further comprising a heat pipe overlaying and thermally engaging the second thermally conductive member, wherein the heat pipe is configured to direct heat from the second thermally conductive member to the liquid cooling unit.

8. The liquid cooled NIC assembly of claim 7 further comprising a transceiver receptacle configured to receive and operatively engage a transceiver module, wherein the second thermally conductive member is configured to direct heat from the transceiver module received by the transceiver receptacle to the heat pipe.

9. The liquid cooled NIC assembly of claim 1, wherein the first thermally conductive member is a thermal transfer plate (TTP).

10. The liquid cooled NIC assembly of claim 9, wherein the TTP comprises at least one of an aluminum material, copper material, or a stainless-steel material.

11. The liquid cooled NIC assembly of claim 1, wherein the second thermally conductive member is a thermal pad.

12. A liquid cooled network-interface controller (NIC) assembly configured to receive and operably engage with a transceiver module, the assembly comprising:

- a printed circuit board (PCB);
- a first thermally conductive member supported by the PCB;
- a second thermally conductive member supported by the PCB; and
- a liquid cooling unit defining a first region and a second region,
- wherein the first thermally conductive member is configured to conduct heat toward the first region of the liquid cooling unit,
- wherein the second thermally conductive member is configured to conduct heat toward the second region of the liquid cooling unit, and
- wherein the PCB, the first thermally conductive member, the second thermally conductive member, and the liquid cooling unit are configured to be received by a single slot of a receiver of the NIC assembly.

13. The liquid cooled NIC assembly of claim 12, wherein the liquid cooling unit comprises an inlet, an outlet, and a cooling loop defined between the inlet and the outlet, wherein the cooling loop is configured to circulate coolant for dissipating heat from the first thermally conductive member and the second thermally conductive member.

14. The liquid cooled NIC assembly of claim 12 further comprising a thermally insulative layer disposed between the first thermally conductive member and the second thermally conductive member, wherein the thermally insulative layer is configured to thermally isolate the first thermally conductive member from the second thermally conductive member.

15. The liquid cooled NIC assembly of claim 12, wherein the first region of the liquid cooling unit defines a first height and the second region of the liquid cooling unit defines a second height, wherein the first height is different from the second height.

16. A method of manufacturing a liquid cooled network-interface controller (NIC) assembly configured to receive and operably engage with a transceiver module, the method comprising:

- providing a printed circuit board (PCB);
- disposing a first thermally conductive member on a top surface of the PCB;
- providing a second thermally conductive member proximate the first thermally conductive member, wherein the second thermally conductive member is thermally isolated from the first thermally conductive member; and
- disposing a liquid cooling unit proximate the first thermally conductive member and the second thermally conductive member,
- wherein the first thermally conductive member is configured to conduct heat toward the liquid cooling unit,
- wherein the second thermally conductive member is configured to conduct heat toward the liquid cooling unit, and
- wherein the liquid cooling unit is configured to dissipate heat from the first thermally conductive member and the second thermally conductive member.

17. The method of claim 16, wherein the liquid cooling unit comprises an inlet, an outlet, and a cooling loop defined between the inlet and the outlet, wherein the cooling loop is configured to circulate coolant for dissipating heat from the first thermally conductive member and the second thermally conductive member.

18. The method of claim 17, wherein a path defined by the cooling loop of the liquid cooling unit overlays the first thermally conductive member and the second thermally conductive member.

19. The method of claim 16 further comprising disposing a thermally insulative layer between the first thermally conductive member and the second thermally conductive member, wherein the thermally insulative layer is configured to thermally isolate the first thermally conductive member and the second thermally conductive member.

20. The method of claim 16, wherein the method further comprises disposing a heat pipe at least partially on the second thermally conductive member, wherein the heat pipe is configured to thermally engage the second thermally conductive member and the liquid cooling unit.

21. The liquid cooled NIC assembly of claim 12, wherein the first thermally conductive member is disposed between the PCB and the second thermally conductive member, such that the second thermally conductive member is supported by the PCB via the first thermally conductive member.

* * * * *